United States Patent
Okada

(10) Patent No.: US 7,666,734 B2
(45) Date of Patent: Feb. 23, 2010

(54) SEMICONDUCTOR DEVICE HAVING A FUSE

(75) Inventor: Norio Okada, Tokyo (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/085,863

(22) Filed: Mar. 22, 2005

(65) Prior Publication Data

US 2005/0164430 A1 Jul. 28, 2005

Related U.S. Application Data

(62) Division of application No. 10/660,168, filed on Sep. 11, 2003, now Pat. No. 6,914,319, which is a division of application No. 09/822,791, filed on Mar. 30, 2001, now abandoned.

(30) Foreign Application Priority Data

Mar. 30, 2000 (JP) ............................. 2000-92676

(51) Int. Cl.
 *H01L 21/8238* (2006.01)
(52) U.S. Cl. ............................. 438/215; 257/E21.109
(58) Field of Classification Search .............. 438/135, 438/601, 602, 215, 128, 129; 257/128, 129, 257/215, 135, 601, 602, E21.109, E21.409
See application file for complete search history.

(56) References Cited

U.S. PATENT DOCUMENTS

| 6,100,118 | A * | 8/2000 | Shih et al. | 438/132 |
| 6,777,318 | B2 * | 8/2004 | Jeng et al. | 438/598 |
| 2003/0052440 | A1 * | 3/2003 | Tsuura | 267/100 |
| 2004/0067623 | A1 * | 4/2004 | Chuang | 438/467 |

FOREIGN PATENT DOCUMENTS

| JP | H08-213465 | 8/1996 |
| JP | H11-017011 | 1/1999 |
| JP | H11-224900 | 8/1999 |
| JP | 2000-012691 | 1/2000 |

* cited by examiner

*Primary Examiner*—Davienne Monbleau
*Assistant Examiner*—Hoa B Trinh
(74) *Attorney, Agent, or Firm*—Muirhead and Saturnelli, LLC

(57) ABSTRACT

A fuse used for redundancy function in a semiconductor device includes a pair of fuse terminals formed as a common layer with top interconnect lines by using a damascene technique, and a fuse element made of refractive metal and bridging the fuse terminals. The fuse element is formed as a common layer with the protective cover films covering the interconnect lines.

9 Claims, 10 Drawing Sheets

PRIOR ART FIG. 2A
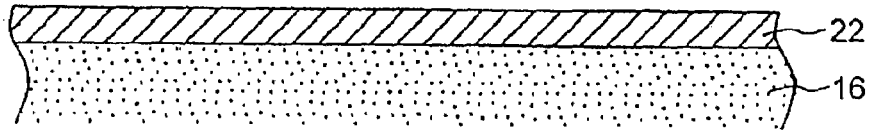
PRIOR ART FIG. 2B
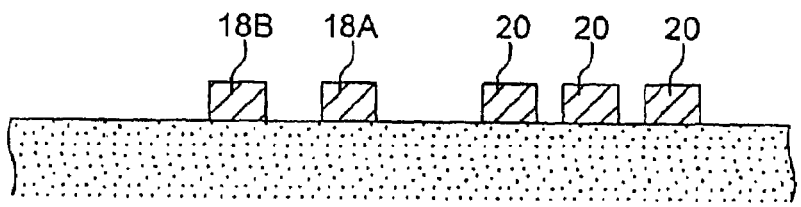
PRIOR ART FIG. 2C
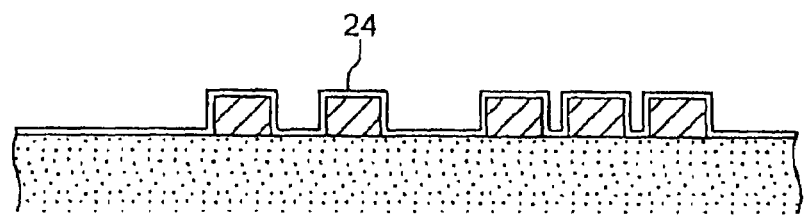
PRIOR ART FIG. 2D
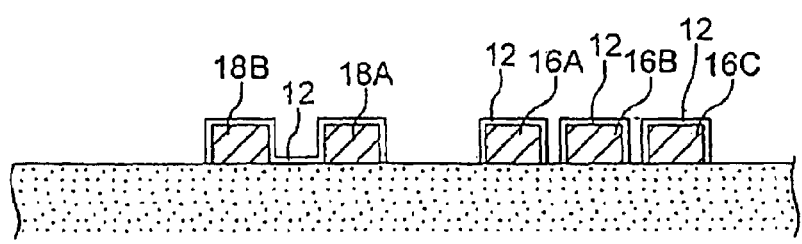

PRIOR ART FIG. 3A
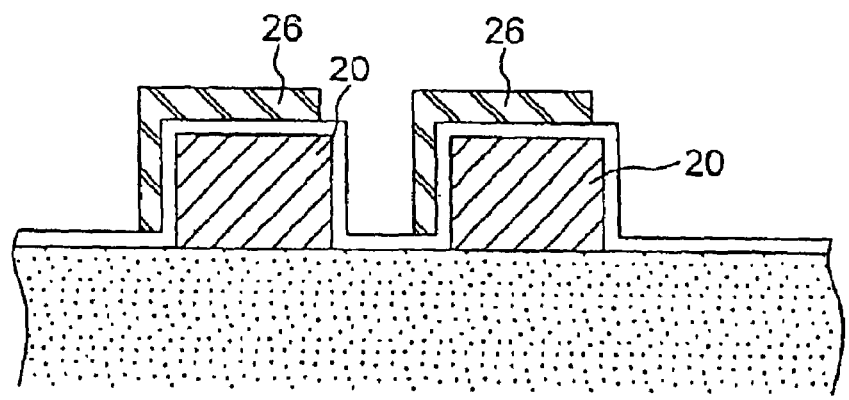
PRIOR ART FIG. 3B
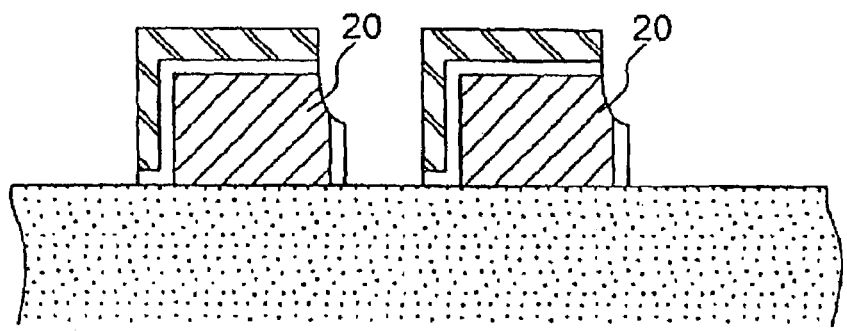

PRIOR ART FIG. 4
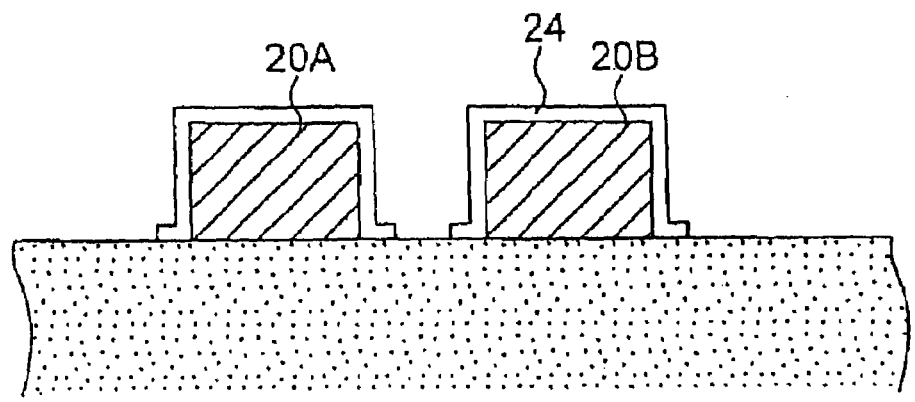
FIG. 5
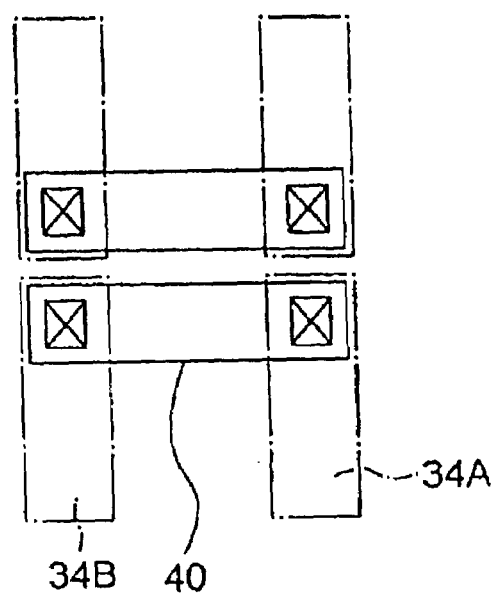

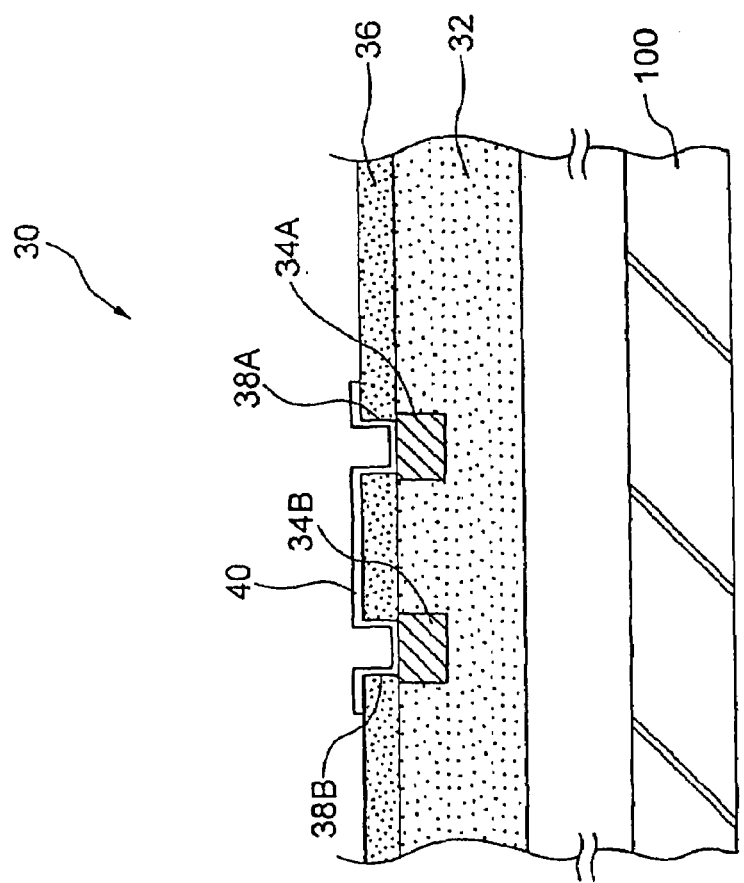

SEMICONDUCTOR DEVICE HAVING A FUSE

CROSS REFERENCE TO RELATED APPLICATIONS

This application is a divisional of U.S. patent application Ser. No. 10/660,168, filed Sep. 11, 2003, now U.S. Pat. No. 6,914,319, which is a divisional of U.S. patent application Ser. No. 09/822,791, filed on Mar. 30, 2001 (abandoned).

BACKGROUND OF THE INVENTION (a) Field of the Invention

The present invention relates to a semiconductor device having a fuse and, more particularly, to an improvement of the structure of the fuse element in a fuse.

(b) Description of the Related Art

Most of semiconductor devices such as a DRAM or SRAM have fuse blocks for use in redundancy circuits. When a defect is found in a memory cell during a product test, the defective memory cell is replaced with a redundancy memory cell by cutting an associated fuse element while irradiating the fuse element with a laser beam.

The fuse block is also used in a multi-mode semiconductor memory device such as DRAM, wherein a plurality of control circuits are provided each for effecting one of a plurality of operational modes such as a static column mode or a high-speed phase mode. One of the control circuits is selected for effecting a specified operational mode, after fabrication of the semiconductor device, by cutting the fuse elements other than the specified fuse element, whereby the other control circuits are inactivated.

Along with the increase of demand for higher integration and finer patterning of semiconductor devices, a multi-level interconnect structure is increasingly used wherein a plurality of interconnect layers are alternately stacked with a plurality of interlevel dielectric layers, and connected together by using via plugs embedded in the dielectric layers. The multi-level interconnect structure includes a fuse block including a plurality of fuses each having a pair of terminals and a fuse element, which are formed on an underlying dielectric film and covered by an overlying dielectric protective film. The underlying dielectric film is generally formed as a top interlevel dielectric layer on which the top interconnect layer is formed.

FIG. 1 shows a conventional structure of the fuse block such as described in Patent Publication JP-A-11-17011. The fuse block, generally designated by numeral 10, has a plurality of fuses each including a pair of fuse terminals 18A and 18B and a fuse element 12, which are formed on an underlying dielectric film 14 as a common layer with interconnect lines such as signal lines 16A, 16B and 16C. Depiction of the overlying protective film is omitted therein for simplification purpose. The fuse element 12 has a smaller thickness and bridges the fuse terminals 18A and 18B having a larger thickness, which is comparable to the thickness of the interconnect lines.

Each of the fuse terminals 18A and 18B and the interconnect lines 16A, 16B and 16C has a two-layer structure including an aluminum (Al) body film 20 and a TiN protective film, whereas the fuse element 12 is implemented by a single layer of the TiN film. The TiN film 12 has a lower reflectance and thus a higher absorbance compared to the Al film, and is readily fused by a laser beam having a relatively lower energy level.

The fuse structure is fabricated as detailed below. Referring to FIG. 2A, an Al film 22 is formed on an underlying interlevel dielectric film 16 overlying a semiconductor substrate 100. The Al film 22 is patterned to form interconnect lines 20 including fuse terminals 18A and 18B, as shown in FIG. 2B, followed by depositing a TiN film 24 on the entire surface including the surfaces of the interconnect lines, as shown in FIG. 2C. The TiN film is then patterned to form a two-layer structure of the interconnect liens 20 as well as the fuse elements 12 each connecting the pair of fuse terminals 18A and 18B together.

With the trend for reduction of the chip size of the semiconductor device, the occupied area for the interconnect lines and the fuse structure as well as the line space between the fuses and between the fuse terminals should be reduced. The reduction of the occupied area for the fuse structure has some problems.

First, the reduction of the line space reduces the allowable positioning margin of the etching mask used for patterning the TiN film, thereby generating defects in the fuse terminals and the interconnect lines.

FIGS. 3A and 3B show examples of the defects caused by the reduction of the positioning margin. In FIG. 3A, a misalignment occurs between the etching mask 26 and Al films 20 of the interconnect lines, and accordingly the Al film 20 is slightly etched after the patterning to cause reduction of the effective sectional area for the interconnect lines, as shown in FIG. 3B, thereby increasing the electric resistance of the interconnect lines.

Second, the reduction of the line space raises the aspect ratio during the patterning step for the TiN film, wherein the aspect ratio is defined as the ratio of the line thickness to the line space. The higher aspect ratio is likely to cause, as shown in FIG. 4, an incomplete etching of the refractive metal film 24 at the gap between the Al films 20A and 20B of the interconnect lines, thereby generating a short circuit failure therebetween.

SUMMARY OF THE INVENTION

In view of the above problems in the conventional techniques, it is an object of the present invention to provide a fuse structure which is capable of allowing a higher integration and a finer patterning while preventing the increase of the electric resistance or a short circuit failure.

The present invention provides, in a first aspect thereof, a semiconductor device comprising a substrate, a first dielectric film overlying the substrate, a pair of fuse terminals embedded in a surface portion of the first dielectric film, a second dielectric film formed on the first dielectric film and the fuse terminals, the second dielectric film having a pair of openings each exposing one of the fuse terminals, a fuse element formed on the second dielectric film and connected to the pair of fuse terminals through the openings.

The present invention also provides, in a second aspect thereof, a semiconductor device comprising a substrate, a first dielectric film overlying the substrate, a pair of fuse terminals embedded in a surface portion of the first dielectric film, a fuse element formed on the first dielectric film and connected to the pair of fuse terminals.

In accordance with the present invention, the combination of the embedded structure of the fuse terminals and the associated fuse element allows a higher integration and a finer patterning of the semiconductor device while suppressing occurrence of increase of the line resistance and a short circuit failure.

The above and other objects, features and advantages of the present invention will be more apparent from the following description, referring to the accompanying drawings.

BRIEF DESCRIPTION OF THE DRAWINGS

FIGS. 2A to 2D are sectional views of the fuse structure of FIG. 1, consecutively showing the steps of forming the fuse structure.

FIGS. 3A and 3B sectional views of another conventional semiconductor device, showing the first defect involved in the interconnect lines.

FIG. 4 is a sectional view of another semiconductor device showing the second defect therein involved in the interconnect lines.

FIG. 5 is a top plan view of a conceivable example of a fuse structure formed by the present invention.

FIG. 6 is a sectional view of a fuse structure in a semiconductor device according to a first embodiment of the present invention.

PREFERRED EMBODIMENTS OF THE INVENTION

Figure 1:
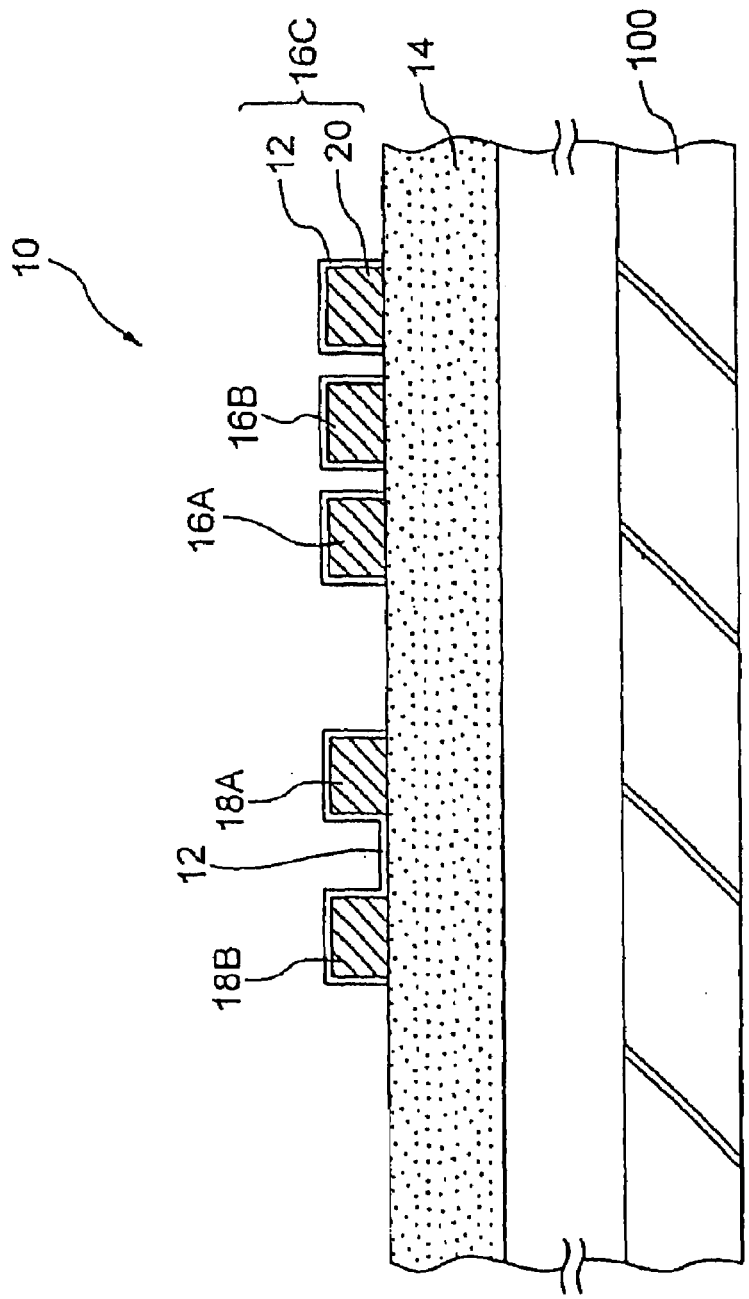
FIG. 1 is a sectional view of a conventional semiconductor device, showing the fuse structure therein.

In the first and second aspects of the present invention, preferable examples of the refractive metal (or high-melting-point metal) film include, although not limited to, a TiN film, a two-layer film including TiN and Ti films, and a WTi film, in view of the absorbance capability for an irradiated ray such as a laser or infrared ray. In other words, each of these films has a lower reflectance for the irradiated ray.

Preferable examples of the materials of the fuse terminals include, although not limited to, Al, Al alloy, Cu and Cu alloy. The preferable thickness of the refractive metal is 100 angstroms or more.

In a preferred embodiment of the first aspect of the present invention, the fuse terminals are formed in a common step with forming the top interconnect lines. In other words, the fuse terminals are formed as a common layer with the top interconnect lines.

In an embodiment of the present invention, if a is large number of parallel fuses, such as shown in FIG. 5, are disposed with a small space, it may be difficult to form separate openings for fusing respective fuse elements, thereby limiting a further finer patterning or a further higher integration.

In the second aspect of the present invention, the refractive metal film implementing the fuse element is formed directly on the embedded fuse terminals, for achieving the further finer patterning and the further higher integration. The direct deposition and patterning of the refractive metal film on the interlevel dielectric film on which the interconnect lines are formed allows obviation of forming the openings, which may prevent the further finer patterning in the first aspect. In addition, the second aspect of the present invention allows reduction of the number of fabrication steps for the fuse structure.

In a preferred embodiment of the second aspect, the fuse terminals are formed on the dielectric film on which the top interconnect layer of the multi-level interconnect structure. In this case, the refractive metal implementing the fuse elements acts as a protective film for preventing the diffusion of the underlying metallic film, i.e., body of the interconnect lines such as Cu or Al film.

In a further preferred embodiment of the second aspect, electrode pads for connecting the semiconductor device with an external circuit has a two-layer structure including a body film formed as a common layer with the fuse terminals and the top interconnect lines and a protective film formed as common layer with the fuse elements and the protective films for the interconnect lines.

A protective dielectric film having openings for exposing the electrode pads and an overcoat dielectric film having openings for exposing the electrode pads and the fuse elements may be consecutively formed on the fuse elements. Examples of the protective dielectric film include a $SiO_2$ film, a SiN film, a SiON film or combination of one or more of the recited layer, having a preferable thickness of 500 to 10,000 angstroms.

Now, the present invention is more specifically described with reference to accompanying drawings, wherein similar constituent elements are designated by similar reference numerals.

Referring to FIG. 6, a semiconductor device according to an embodiment of the present invention includes an interlevel dielectric ($SiO_2$) film 32 overlying a substrate 100, a 0.2-μm-thick SiN film 36 formed on the dielectric film 32, and a fuse block 30 formed on the dielectric film 32 and the SiN film 36. The fuse block 30 includes a plurality of fuses each including a fuse element 40 and a pair of associated fuse terminals 34A and 34B, which are formed by an Al or Cu film as a common layer with the top interconnect lines not shown.

The fuse terminals 34A and 34B are embedded using a damascene technique in the surface portion of the dielectric film 32, or more specifically, in the trenches formed in the dielectric film 32 so that the tops of the fuse terminals 34A and 34B are flush with the top surface of the dielectric film 32.

The SiN film 36 has an opening on each of the top of the fuse terminals 34A and 34B. The fuse element 40 is formed on top of the SiN film 36 as a 1000-angstrom-thick TiN film, which extends toward the bottom of the opening of the SiN film 36 and is in contact with the top of the fuse terminals 34A and 34B. The fuse element 40 may be another low-reflective/high melting point metal or alloy such as Ti film, TiW film or a combination of TiN and Ti films.

The embedded structure or single damascene structure of the interconnect lines and the fuse terminals allows a finer patterning and a higher density.

Figure 7A:
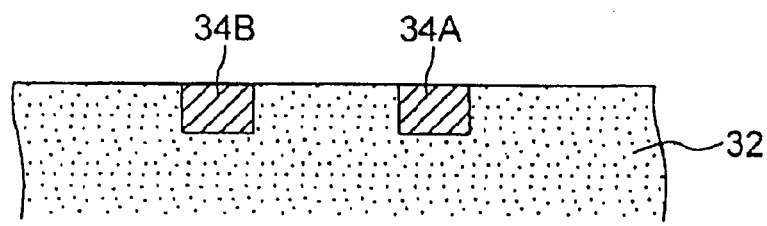
FIGS. 7A to 7C are sectional views of the fuse structure of FIG. 6 during the consecutive fabrication steps thereof.
Figure 7B:
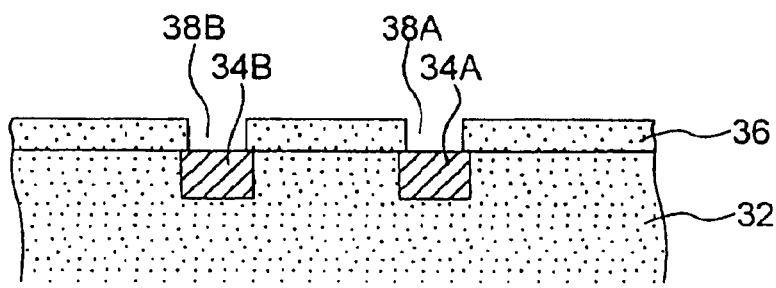

The fuse structure shown in FIG. 6 is obtained as detailed below. Referring to FIG. 7A, interconnect lines including the fuse terminals 34A and 34B are formed in respective trenches of a dielectric film 32. Subsequently, a 0.2-μm-thick SiN film 36 is deposited by a plasma-enhanced CVD technique on the dielectric film 32, as shown in FIG. 7B, followed by formation of openings 38A and 38B exposing the fuse terminals 34A and 34B, respectively.

Figure 7C:
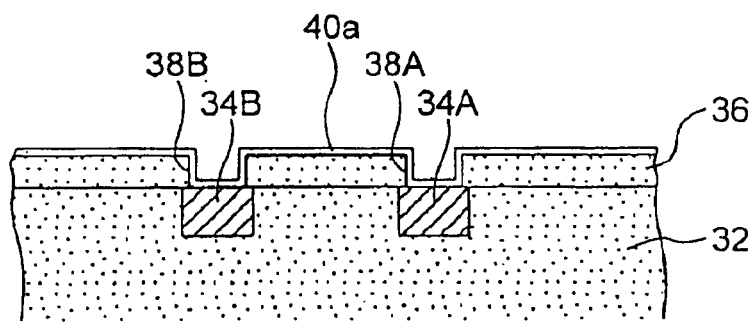

Subsequently, as shown in FIG. 7C, a refractive metal film, such as a TiN film 40a, having a low reflectance is deposited by sputtering. The sputtered TiN film 40a is then patterned using a plasma-enhanced etching technique to form fuse elements 40 each bridging the fuse terminals 34A and 34b together, thereby obtaining the fuse structure 30 shown in FIG. 6.

Figure 8:
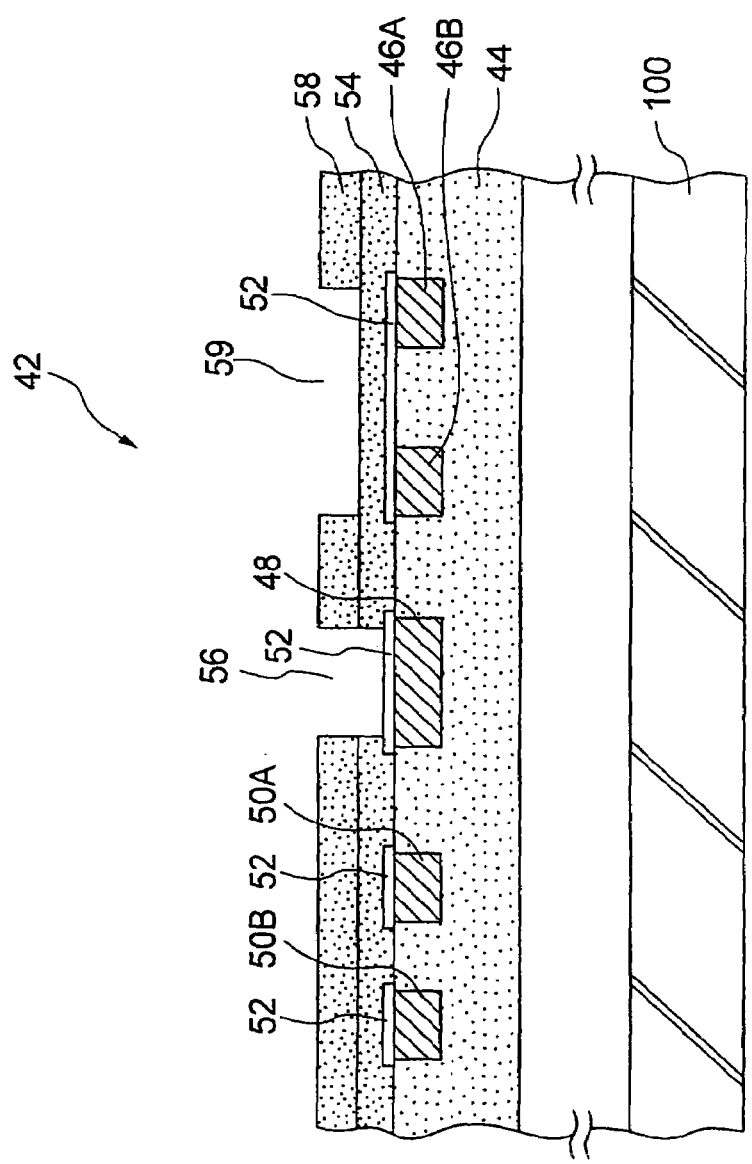
FIG. 8 is a sectional view of a fuse structure in a semiconductor device according to a second embodiment of the present invention.

Referring to FIG. 8, a fuse structure 42 in a semiconductor device according to a second embodiment of the present invention is an example of the second aspect. The fuse structure 42 includes an interlevel dielectric film 44 made of $SiO_2$, fuse terminals 46A and 46B made of Cu and embedded in the interlevel dielectric film 44 as a common layer with electrode pads 48 and top interconnect lines 50A and 50B, fuse elements 52 implemented by a TiN film as a common layer with the protective film for prevention of diffusion of Cu from the interconnect lines 50A and 50B and electrode pads 48, a top dielectric film 54 formed on the interlevel dielectric film 44 and the fuse elements 52, and a polyimide overcoat film 58.

The Cu films 46 and 50 are covered by the top dielectric film 54 made of SiO$_2$ except for the electrode pads 48 which are exposed by openings 56 formed in the top dielectric film 54 and the polyimide overcoat film 58. The polyimide film 58 has also openings 59 therein for exposing portions of the top dielectric film 54 overlying the fuse elements 52.

The polyimide film 58 has an undesirable high absorption for the laser beam, and thus is selectively removed at the portions overlying the fuse elements 52 to form the openings 59.

In the present embodiment, since the Cu films are formed by a damascene process and the fuse elements made of a refractive metal are formed directly on the fuse terminals, a finer patterning and a higher integration can be achieved for the fuse structure.

In addition, the obviation of SiN dielectric film between the fuse terminals and the fuse element allows a smaller number of the fabrication steps.

Figure 9A:
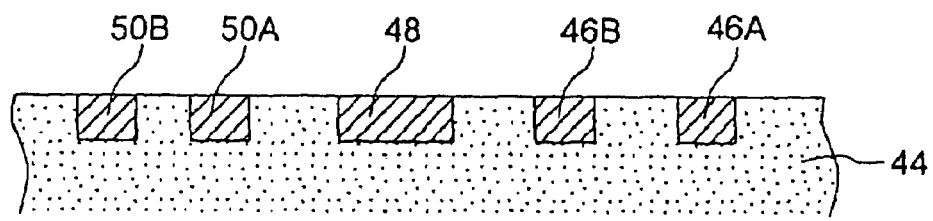
FIGS. 9A to 9F are sectional views of the fuse structure of FIG. 8 during the consecutive fabrication steps thereof.

In fabrication of the fuse structure shown in FIG. 8, a damascene process is first conducted in the interlevel dielectric film 44 to form fuse terminals 46A and 46B together with bodies 48 of electrode pads and bodies 50A and 50B of top interconnect lines, as shown in FIG. 9A.

Figure 9B:
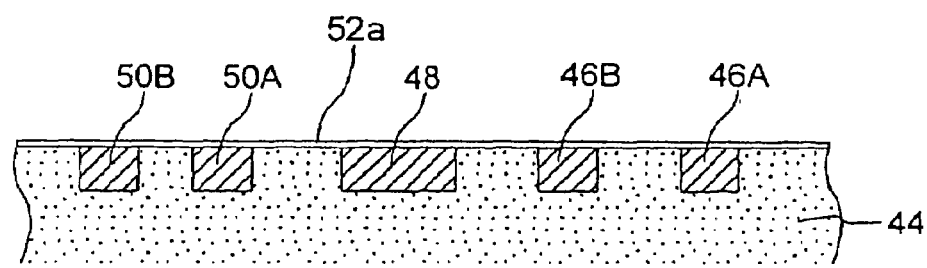

A TiN film 52a is then deposited on the interlevel dielectric film 44 as well as on the fuse terminals 46A and 49B and the bodies 48, 50A and 50B of the interconnect lines and the electrode pads, as shown in FIG. 9B.

Figure 9C:
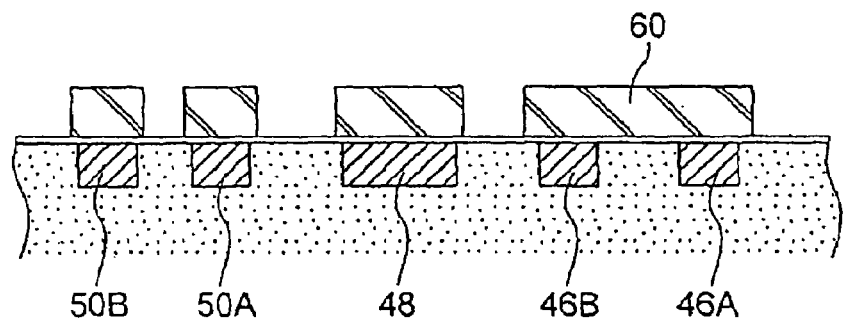
Figure 9D:
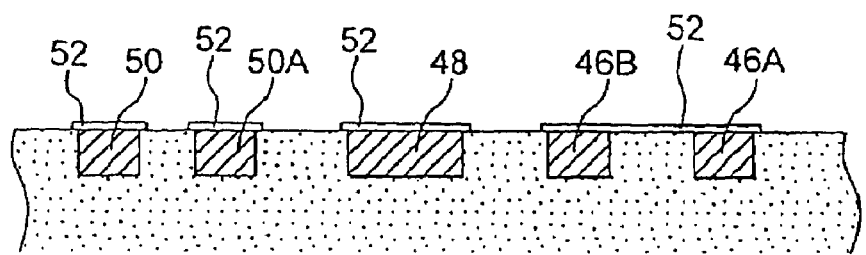

Thereafter, as shown in FIG. 9C, an etching mask 60 is formed on the TiN film 52a by using a photographic patterning step.

The TiN film 52a is then subjected to etching using the etching mask 60 to leave the fuse elements 52 on the interlevel dielectric film 44 and the fuse terminals, protective films 52 on the bodies 50A and 50b of the interconnect lines.

Figure 9E:
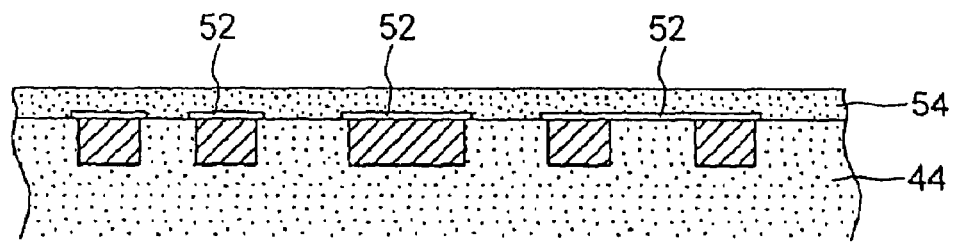
Figure 9F:
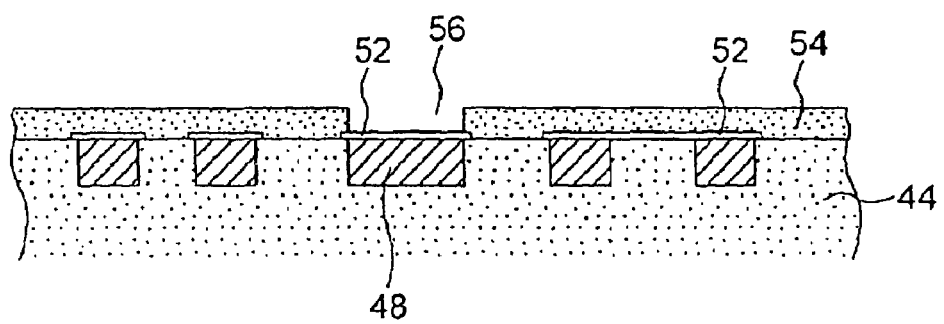

A top dielectric film 54 made of SiON is then formed on the interlevel dielectric film 44 by using a plasma-enhanced CVD technique, as shown in FIG. 9E, followed by etching the top dielectric film 54 to form openings 56 therein, the openings 56 exposing the TiN film patterns 52 on the electrode pads 48, as shown in FIG. 9F.

A polyimide overcoat film 58 is then formed on the top dielectric film 54, followed by patterning thereof to form openings 59 in the top dielectric film 54 and the polyimide overcoat film 58. Thus, the structure shown in FIG. 8 can be obtained.

Referring to FIGS. 10A to 10D, there are shown superposed patterns 62 for showing the locational relationship between the film patterns formed on the semiconductor device, a first mask 76 for the fuse terminals including electrode pads and the top interconnect lines, a second mask 78 for the fuse elements, and a third mask 80 for through-holes receiving therein via-plugs connecting the top interconnect lines to the lower layer interconnect lines, respectively. The superposed patterns 62 are obtained by logical OR of the mask patterns 76, 78 and 80.

In forming the etching mask 60 shown in FIG. 9C in the second embodiment, a photo-resist film is formed on the TiN film 52a by using a spin-coating technique etc., followed by patterning thereof by using the first mask 76.

Figure 10A:
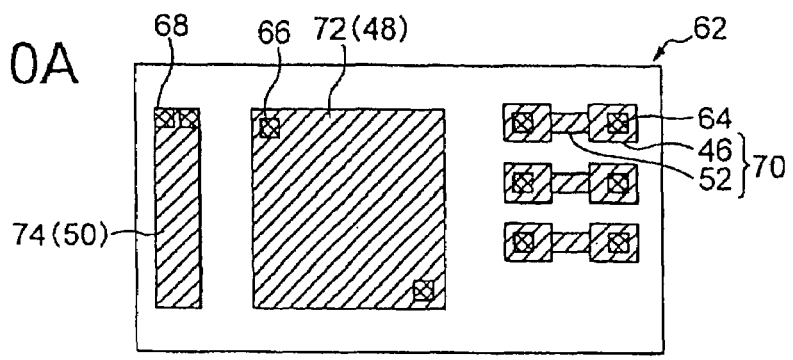
FIG. 10A is a top plan view of patterns formed in a semiconductor device.
Figure 10B:
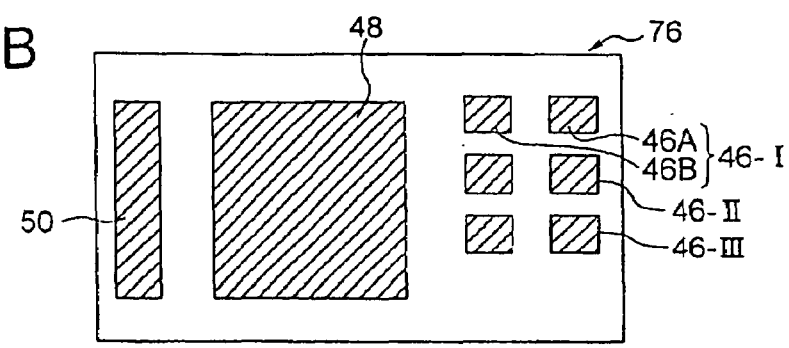
FIGS. 10B to 10D are top plan views of masks used for fabrication of the patterns of FIG. 10A.
Figure 10C:
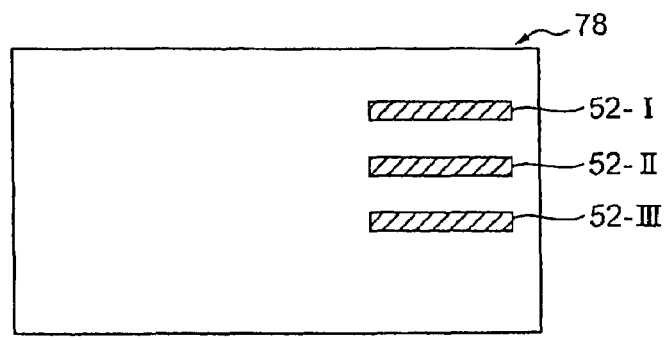
Figure 10D:
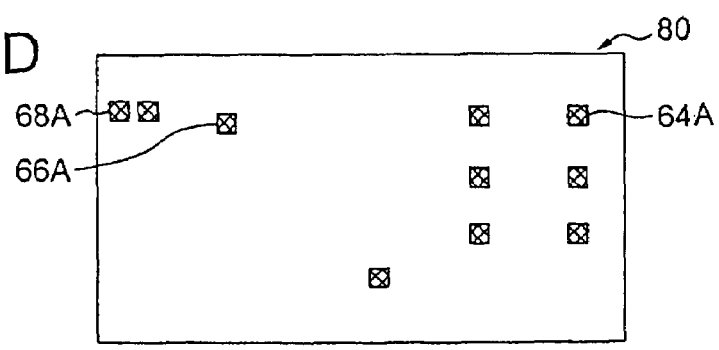

In FIG. 10B, the depicted first mask 76 includes patterns 46-I, 46-II and 46-III for three fuse terminal pairs 46 each including terminal patterns 46A and 46B, a pattern 48 for an electrode pad 72 and a pattern 50 for a top interconnect line 74.

In forming the fuse elements 52 thereafter, the second mask 10C is used. The depicted second mask 78 includes patterns 52-I, 52-II and 52-III for three fuse elements 52, which are aligned to the fuse terminals 46 with some margin, as shown in FIG. 10A.

Before forming the fuse terminals 46, the underlying interlevel dielectric film is also patterned by using the third mask 10D to form via-plugs 64, 66 and 68. The depicted third mask 10D includes patterns 64A, 66A and 68A for the through-holes 64, 66 and 68 in the interlevel dielectric film, which are aligned to the fuse terminals 46 etc. with some margin, as shown in FIG. 10A. The alignment of the three masks 76, 78 and 80 on the level of the fuse terminals 46 is achieved by using the margins.

Since the above embodiments are described only for examples, the present invention is not limited to the above embodiments and various modifications or alterations can be easily made therefrom by those skilled in the art without departing from the scope of the present invention.

What is claimed is:

1. A method for forming a semiconductor device comprising the steps of:
   forming a first dielectric film overlying a substrate;
   embedding an electrode pad and a pair of fuse terminals in a surface portion of said first dielectric film, wherein the electrode pad is formed in a first common layer with the pair of fuse terminals;
   forming a refractive metal on said first dielectric film, wherein the refractive metal is in direct contact with said pair of fuse terminals and said electrode pad;
   patterning said refractive metal to form a fuse element in contact with said pair of fuse terminals and to form a first protective film on, and in direct contact with, said electrode pad, wherein the first protective film is formed in a second common layer with the fuse element;
   forming a second dielectric film on: said first dielectric film, said first protective film in direct contact with said electrode pad and said fuse element in direct contact with said fuse terminals; and
   forming a first opening in said second dielectric film to expose at least a portion of said first protective film on the electrode pad, wherein the first opening formed in said second dielectric film does not expose said fuse element in contact with said pair of fuse terminals.

2. The method as defined in claim 1, wherein said embedding step forms additionally a plurality of top interconnect lines in said surface portion of said first dielectric film.

3. The method as defined in claim 2, wherein said patterning step forms additionally a plurality of second protective films on said plurality of top interconnect lines.

4. The method as defined in claim 1, further comprising the steps of forming a third dielectric film on said second dielectric film, and forming a second opening in said third dielectric film to expose at least a portion of said electrode pad, and a third opening formed in said third dielectric film to expose a part of the second dielectric film above a portion of said fuse element.

5. The method as defined in claim 1, wherein said refractive metal forming step forms at least one film selected from the group consisting of: a TiN film, a TiW film and a combination of a TiN film and a Ti film.

6. The method as defined in claim 1, wherein said electrode pad and said pair of fuse terminals are made of Al, Al alloy, Cu, or Cu alloy.

7. The method as defined in claim 1, further comprising the steps of forming a first, second and third trenches in said first dielectric film apart from one another; and embedding said electrode pad and said pair of fuse terminals in said first, second and third trenches respectively.

8. The method as defined in claim 7, wherein said first, second and third trenches forming step forms additionally a plurality of forth trenches in said first dielectric film, and said electrode pad and said pair of fuse terminals embedding step embeds additionally a plurality of top interconnect lines in respective said plurality of forth trenches.

9. The method as defined in claim 8, further comprising the steps of forming plurality of second protective films on said plurality of top interconnect lines and a portion of said first dielectric film.

* * * * *

UNITED STATES PATENT AND TRADEMARK OFFICE
CERTIFICATE OF CORRECTION

PATENT NO. : 7,666,734 B2 Page 1 of 1
APPLICATION NO. : 11/085863
DATED : February 23, 2010
INVENTOR(S) : Norio Okada It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 330 days.

Signed and Sealed this

Seventh Day of December, 2010

David J. Kappos
*Director of the United States Patent and Trademark Office*